United States Patent
Ding et al.

(10) Patent No.: US 8,612,795 B1
(45) Date of Patent: Dec. 17, 2013

(54) SEGMENTED CLOCK NETWORK FOR TRANSCEIVER ARRAY

(75) Inventors: Weiqi Ding, Fremont, CA (US); Kumara Tharmalingam, Los Gatos, CA (US)

(73) Assignee: Altera Corporation, San Jose, CA (US)

( * ) Notice: Subject to any disclaimer, the term of this patent is extended or adjusted under 35 U.S.C. 154(b) by 746 days.

(21) Appl. No.: 12/847,268

(22) Filed: Jul. 30, 2010

Related U.S. Application Data

(63) Continuation-in-part of application No. 12/717,062, filed on Mar. 3, 2010, now Pat. No. 8,228,102.

(51) Int. Cl.
*G06F 1/04* (2006.01)

(52) U.S. Cl.
USPC .......................................... 713/600; 327/144

(58) Field of Classification Search
USPC .............. 713/600–601; 365/189.02; 327/141, 327/144–150
See application file for complete search history.

(56) References Cited

U.S. PATENT DOCUMENTS

| | | | |
|---|---|---|---|
| 5,892,370 A | 4/1999 | Eaton et al. | |
| 7,042,799 B2 * | 5/2006 | Cho | 365/185.17 |
| 7,075,365 B1 | 7/2006 | Starr et al. | |
| 7,286,007 B1 | 10/2007 | Starr et al. | |
| 7,404,169 B2 | 7/2008 | Lim et al. | |
| 7,646,237 B1 | 1/2010 | Starr et al. | |
| 8,044,724 B2 * | 10/2011 | Rao et al. | 331/17 |
| 8,058,916 B2 * | 11/2011 | Steiner | 327/156 |
| 8,238,452 B1 * | 8/2012 | Sarmah | 375/259 |
| 8,278,980 B1 * | 10/2012 | Dubost et al. | 327/147 |
| 2006/0267661 A1 | 11/2006 | Lim et al. | |
| 2008/0258772 A1 | 10/2008 | Lim et al. | |

\* cited by examiner

*Primary Examiner* — Clifford Knoll
(74) *Attorney, Agent, or Firm* — Okamoto & Benedicto LLP

(57) ABSTRACT

One embodiment relates to a clocking network interconnecting an array of transceivers. The clocking network includes first and second series of multiplexers, each multiplexer in the first and second series being adjacent to a transceiver. The first series of multiplexers selectively transmits clock signals in a first direction of the array, and the second series of multiplexers selectively transmits clock signals in a second direction of the array. Another embodiment relates to an integrated circuit with a programmable interface. The integrated circuit includes an array of physical media attachment circuits, phase-locked loop circuits, and a clock distribution network. The clock distribution network is arranged to be programmed into multiple segments. Each segment distributes a clock signal to a bounded range of the physical media attachment circuits in the array. Another embodiment relates to a method of distributing clock signals in an integrated circuit. Other embodiments and features are also disclosed.

19 Claims, 9 Drawing Sheets

SEGMENTED CLOCK NETWORK FOR TRANSCEIVER ARRAY

CROSS-REFERENCE TO RELATED APPLICATIONS

The present application is a continuation-in-part of U.S. patent application Ser. No. 12/717,062, filed on Mar. 3, 2010, entitled "Phase-Locked Loop Architecture and Clock Distribution System," the disclosure of which is hereby incorporated by reference.

BACKGROUND

1. Technical Field

The present invention relates generally to integrated circuits. More particularly, the present invention relates to clock networks in integrated circuits.

2. Description of the Background Art

A programmable clock network in an integrated circuit may be configured to link various transceiver channels with different clock sources. As such, the clock network may determine multiple channel/clock configurations for the interface. In addition, the performance of the clock network is a substantial determinant of transceiver performance in terms of jitter, skew, latency, and other measures.

On one hand, a high performing and flexible clock network may increase the usability of the interface and so reduce non-recurring engineering needed to satisfy customer requirements. On the other hand, the implementation of a clock network that is both flexible and high-performance is generally expensive in terms of die area used and power consumed.

It is highly desirable to improve the design of clock networks for integrated circuit interfaces with multiple transceiver channels.

SUMMARY

One embodiment relates to a clocking network interconnecting an array of transceivers. The clocking network includes first and second series of multiplexers, each multiplexer in the first and second series being adjacent to a transceiver. The first series of multiplexers selectively transmits clock signals in a first direction of the array, and the second series of multiplexers selectively transmits clock signals in a second direction of the array.

Another embodiment relates to an integrated circuit with a programmable data communications interface. The integrated circuit includes an array of physical media attachment circuits, phase-locked loop circuits, and a clock distribution network. The clock distribution network is arranged to be programmed into multiple segments. Each segment distributes a clock signal to a bounded range of the physical media attachment circuits in the array.

Another embodiment relates to a method of distributing clock signals in an integrated circuit. An array of physical media attachment circuits are programmably configured, each physical media attachment circuit including a clock data recovery circuit for receiving a serial data stream. In addition, a distribution network is programmably configured into a plurality of segments. A plurality of clock signals are generated. The plurality of clock signals are distributed to the array of physical media attachment circuits using the plurality of segments.

Other embodiments and features are also disclosed.

DETAILED DESCRIPTION

The present application discloses an advantageous clocking architecture for an integrated circuit interface with multiple transceiver channels. The disclosed solution is surprisingly cost-effective and efficient while providing substantial flexibility in terms of linking the transceiver channels and the clock sources.

Figure 1:
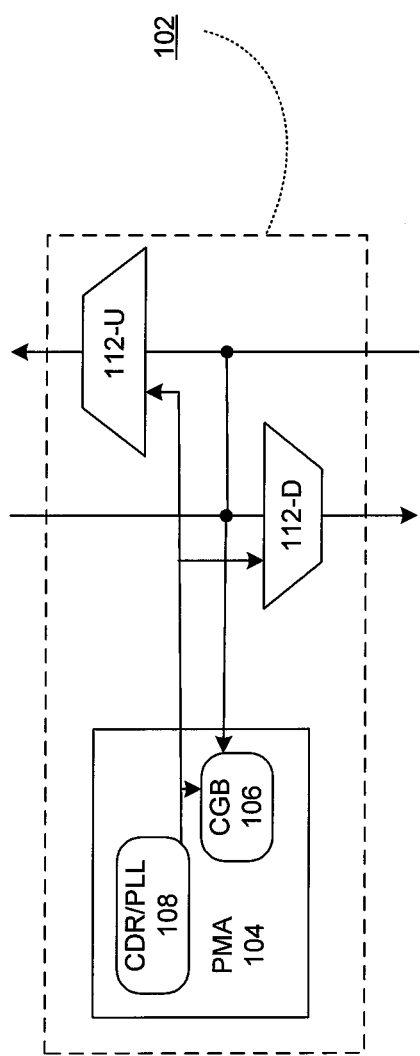
FIG. 1 is a schematic diagram of a circuit module including physical media attachment (PMA) circuitry and associated clock distribution circuitry for a single serial channel in accordance with an embodiment of the invention.

FIG. 1 is a schematic diagram of a circuit module 102 including physical media attachment (PMA) circuitry 104 and associated clock distribution circuitry for a single transceiver channel in accordance with an embodiment of the invention. As described further below, this circuit module 102 may be used as a modular building block to create clock generation and distribution circuitry for an array of transceiver channels.

The PMA circuitry 104 may be arranged to perform, among other functions, serialization of data to be transmitted (conversion from parallel to serial) and de-serialization of received data (conversion from serial to parallel). As seen in FIG. 1, the PMA circuitry 104 may include, among other circuits, a clock generation buffer (CGB) 106 and a clock data recovery/phase-locked loop (CDR/PLL) circuit block 108.

The CDR/PLL circuit block 108 may be configured to receive a serial data stream and phase-align the reference clock signal to transitions in the serial data stream so as to recover a data output signal. The CDR/PLL circuit block 108 may also be configured to generate and output a local clock signal which is provided to the CGB 106 and to the associated clock distribution circuitry. The CGB 106 may include a multiplexer circuit to select between various clock signals. The CGB 106 may receive a local clock signal from the CDR/PLL circuit block 108 and may also receive a clock signal from the associated clock distribution circuitry.

The clock distribution circuitry includes two programmable multiplexers (MUXes): "upward" MUX 112-U and "downward" MUX 112-D. Each MUX 112 has two inputs and an output. A first input is received from the CDR/PLL block 108 of the local PMA circuitry 104 and a second input is received from the circuit module 102 for a neighboring channel. As discussed further below, the upward MUX 112-U receives its second input from a "lower" circuit module 102 and sends its output to an "upper" circuit module 102, while the downward MUX 112-D receives its second input from a "upper" circuit module 102 and sends its output to an "lower" circuit module 102.

Figure 2:
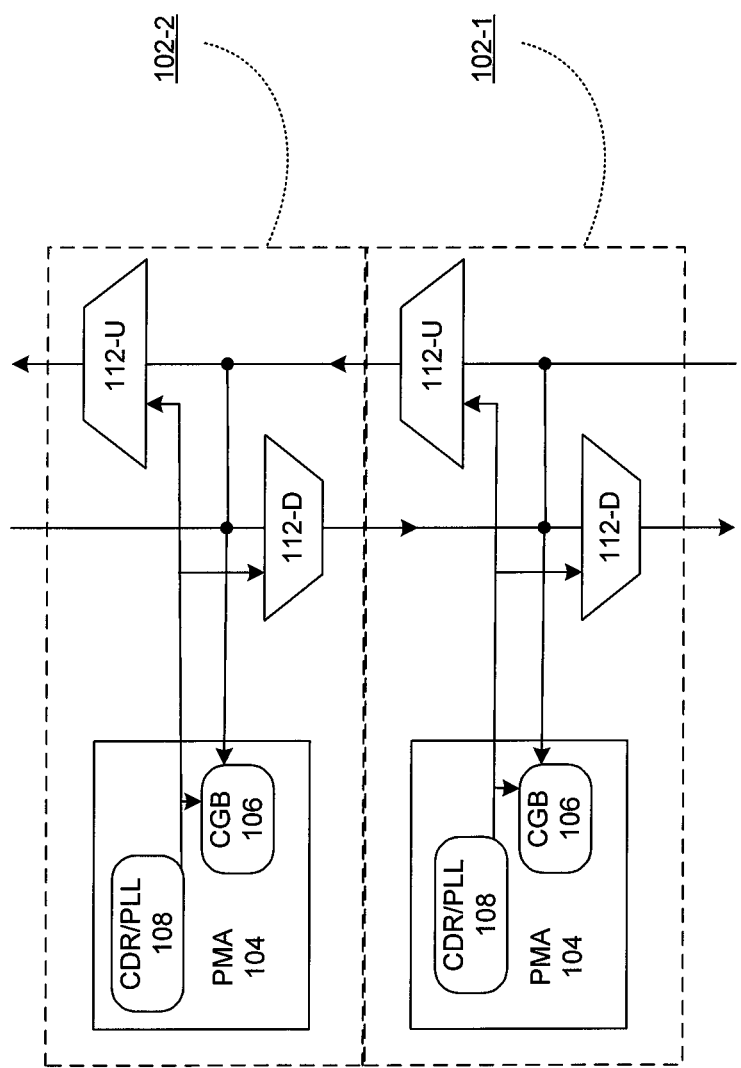
FIG. 2 shows a pair of neighboring circuit modules in accordance with an embodiment of the invention.

FIG. 2 shows a pair of neighboring circuit modules (102-1 and 102-2) in accordance with an embodiment of the invention. As seen, the two circuit modules 102-1 and 102-2 are interconnected by interconnecting their clock distribution circuitry.

The output of the upward MUX 112-U in the lower circuit module 102-1 is provided to the CGB 106 and the upward MUX 112-U of the upper circuit module 102-2. In addition, the output of the downward MUX 112-D in the upper circuit module 102-2 is provided to the CGB 106 and the downward MUX 112-D of the lower circuit module 102-1.

Figure 3:
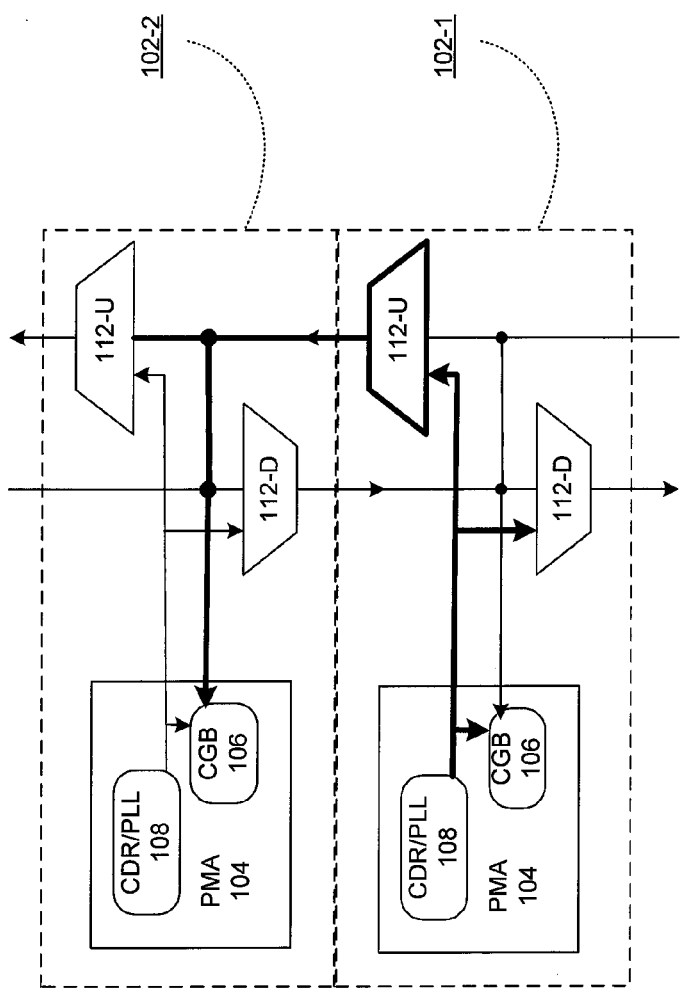
FIG. 3 depicts an example configuration for the circuitry of FIG. 2 in accordance with an embodiment of the invention.

FIG. 3 depicts an example configuration for the circuitry of FIG. 2 in accordance with an embodiment of the invention. In this configuration, the CDR/PLL circuit block 108 in the lower circuit module 102-1 is utilized as a transmit PLL source which supplies a clock signal by way of the clock distribution circuitry to the CGB 106 of the upper circuit module 102-2. The path of the clock signal being distributed are shown in thicker lines. As seen, the upward MUX 112-U in the lower circuit module 102-1 is configured to pass the clock signal to the upper circuit module 102-2.

Figure 4:
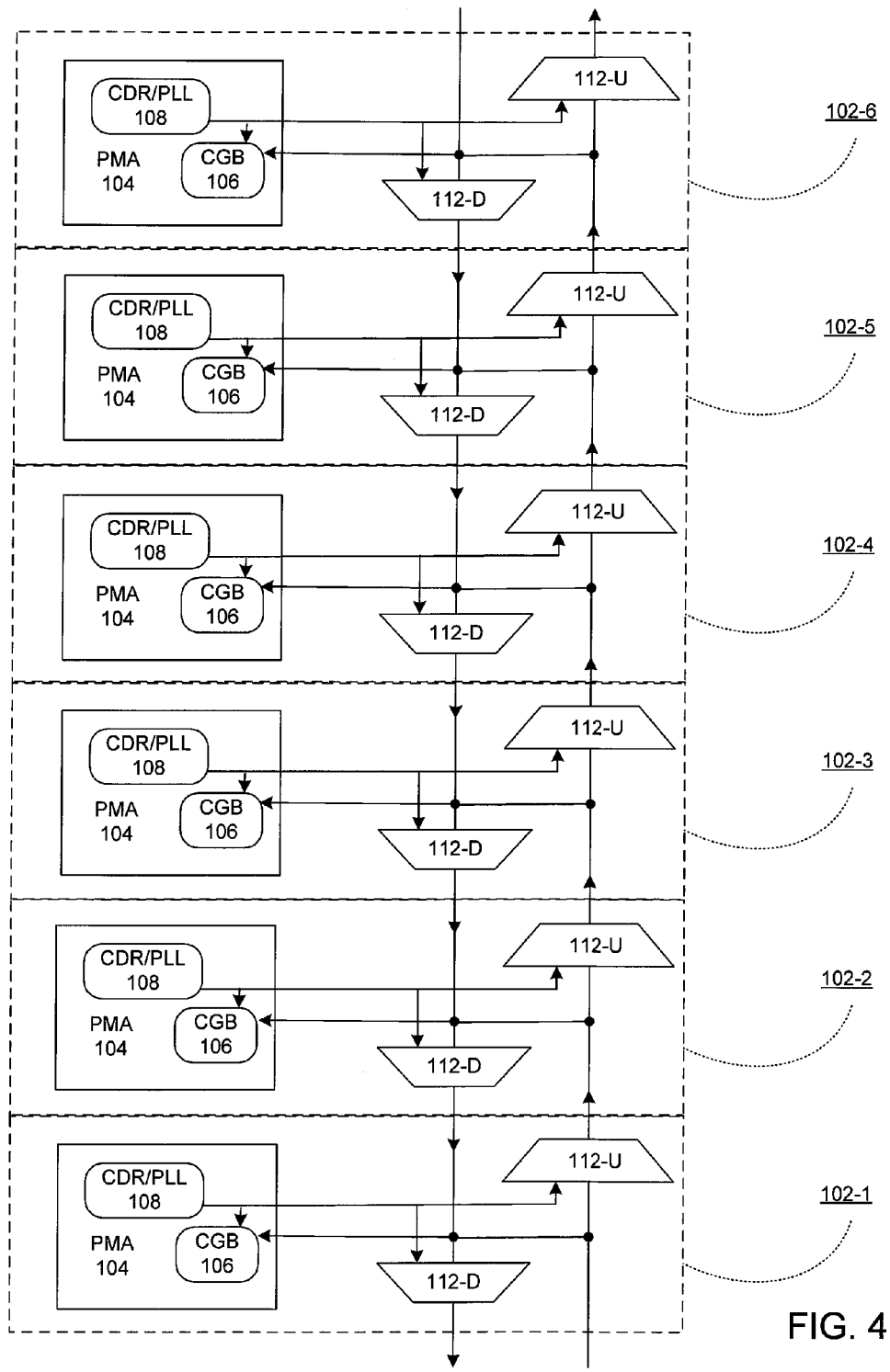
FIG. 4 shows six neighboring circuit modules in accordance with an embodiment of the invention.

While FIGS. 2 and 3 depict an arrangement of two circuit modules 102, many more than two circuit modules 102 may be interconnected into an array. FIG. 4 shows an array of six interconnected circuit modules (102-1, 102-2, 102-3, 102-4, 102-5 and 102-6) in accordance with an embodiment of the invention.

As seen, the output of the upward MUX 112-U in each circuit module 102-$n$ is provided as an input to the CGB 106 and the upward MUX 112-U of the circuit module 102-($n$+1) directly above it in the array. In addition, the output of the downward MUX 112-D in each circuit module 102-$n$ is provided to the CGB 106 and the downward MUX 112-D of the circuit module 102-($n$−1) directly below it in the array.

Note that the array is shown as open-ended in that it continues above and below the six circuit modules shown (102-1 through 102-6). However, if the array did not continue above, then the top circuit module 102-6 need not have the upward MUX 112-U. Similarly, if the array did not continue below, then the bottom circuit module 102-1 need not have the downward MUX 112-D.

Figure 5:
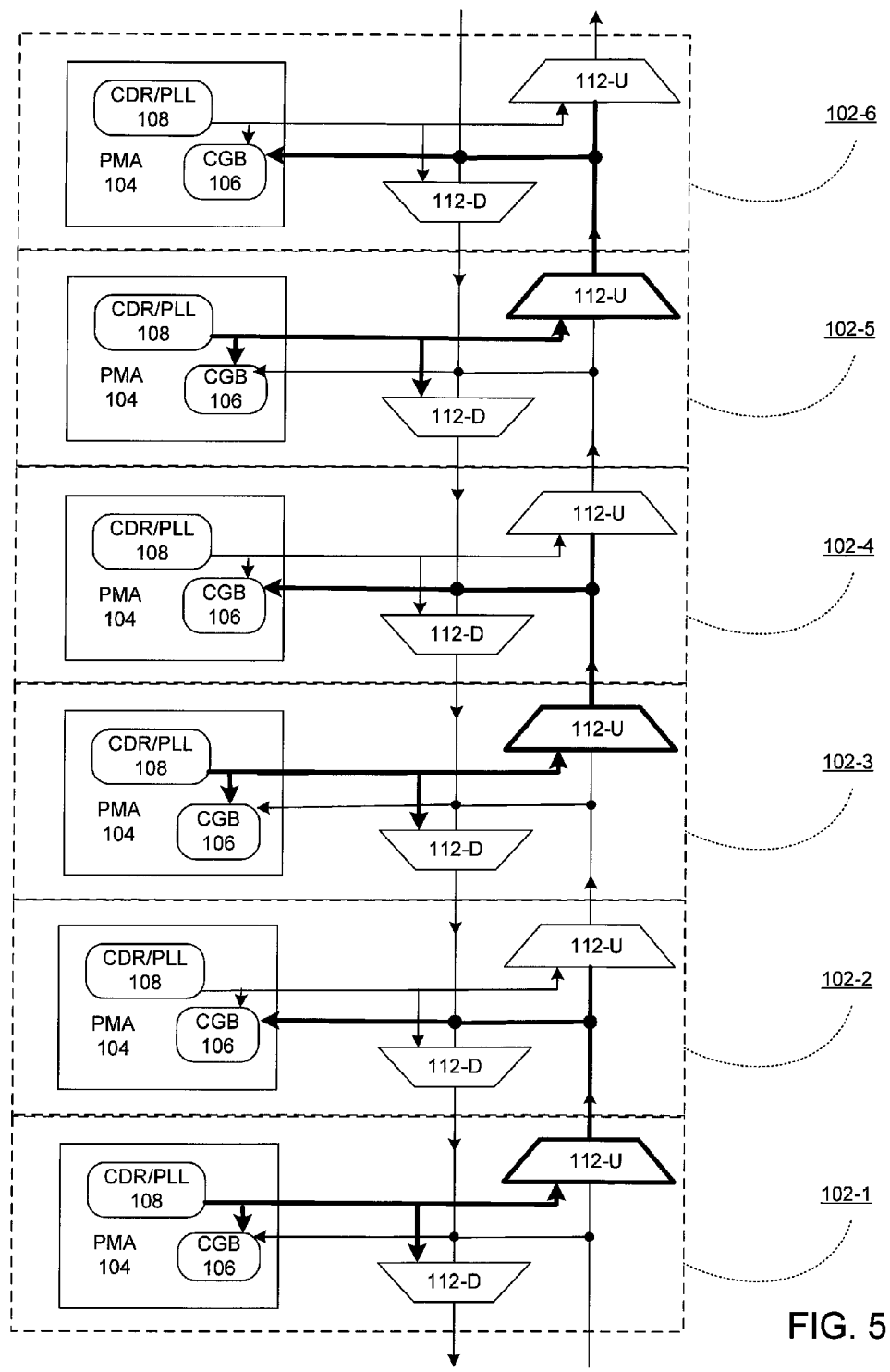
FIG. 5 depicts an example configuration for the circuitry of FIG. 4 in accordance with an embodiment of the invention.

FIG. 5 depicts an example configuration for the circuitry of FIG. 4 in accordance with an embodiment of the invention. The paths of the clock signals being distributed are shown in thicker lines. In this configuration, the CDR/PLL circuit block 108 in each of the odd-numbered circuit modules (102-1, 102-3 and 102-5) is utilized as a transmit PLL source which supplies a clock signal. This clock signal may be selected for local use by the CGB 106 in the same circuit module (102-1, 102-3 and 102-5, respectively).

In addition, the upward MUX 112-U in the same circuit module is configured to the clock signal to the above adjacent even-numbered circuit module (102-2, 102-4, and 102-6, respectively). The CGB 106 in each of the even-numbered circuit modules (102-2, 102-4, and 102-6, respectively) may select and use the clock signal passed from the below adjacent odd-numbered circuit module (102-1, 102-3 and 102-5, respectively).

This configuration effectively creates three clock network segments. The first segment includes the first and second circuit modules (102-1 and 102-2). The first segment includes the first and second circuit modules (102-1 and 102-2). The third segment includes the first and second circuit modules (102-1 and 102-2).

Figure 6:
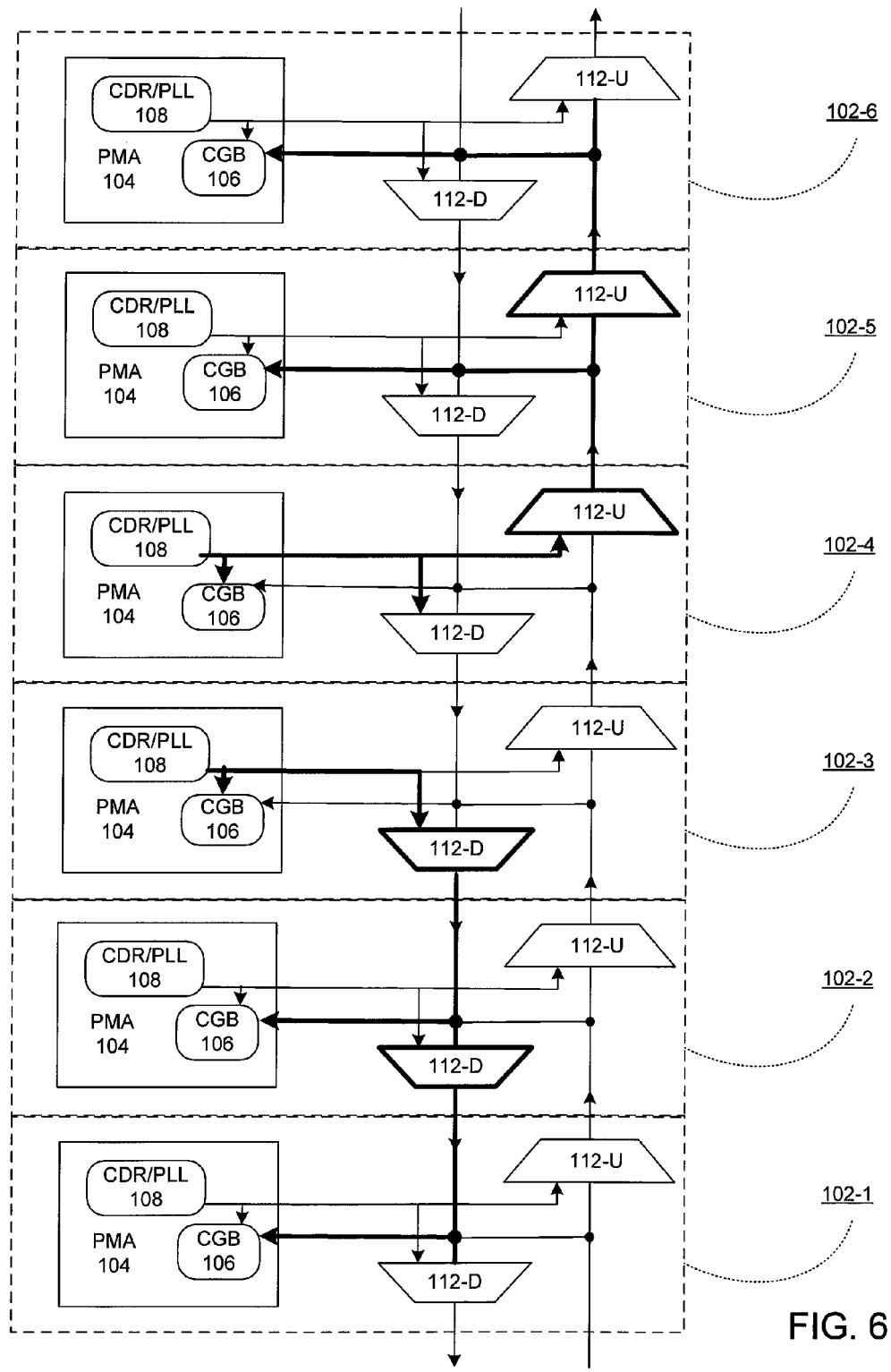
FIG. 6 depicts another example configuration for the circuitry of FIG. 4 in accordance with an embodiment of the invention.

FIG. 6 depicts another example configuration for the circuitry of FIG. 4 in accordance with an embodiment of the invention. The paths of the clock signals being distributed are again shown in thicker lines. In this configuration, the CDR/PLL circuit block 108 in each of the third and fourth circuit modules (102-3 and 102-4) is utilized as a transmit PLL source which supplies a clock signal. This clock signal may be selected for local use by the CGB 106 in the same circuit module (102-3 and 102-4, respectively).

Regarding the clock signal from the fourth circuit module 102-4, the upward MUX 112-U in the fourth and fifth circuit modules (102-4 and 102-5) are respectively configured to pass the clock signal to the fifth and sixth circuit modules (102-5 and 102-6). The CGB 106 in the fifth and sixth circuit modules (102-5 and 102-6) may select and use this clock signal.

Regarding the clock signal from the third circuit module 102-3, the downward MUX 112-D in the third and second circuit modules (102-3 and 102-2) are respectively configured to pass the clock signal to the second and first circuit modules (102-2 and 102-1). The CGB 106 in the second and first circuit modules (102-2 and 102-1) may select and use this clock signal.

Figure 7:
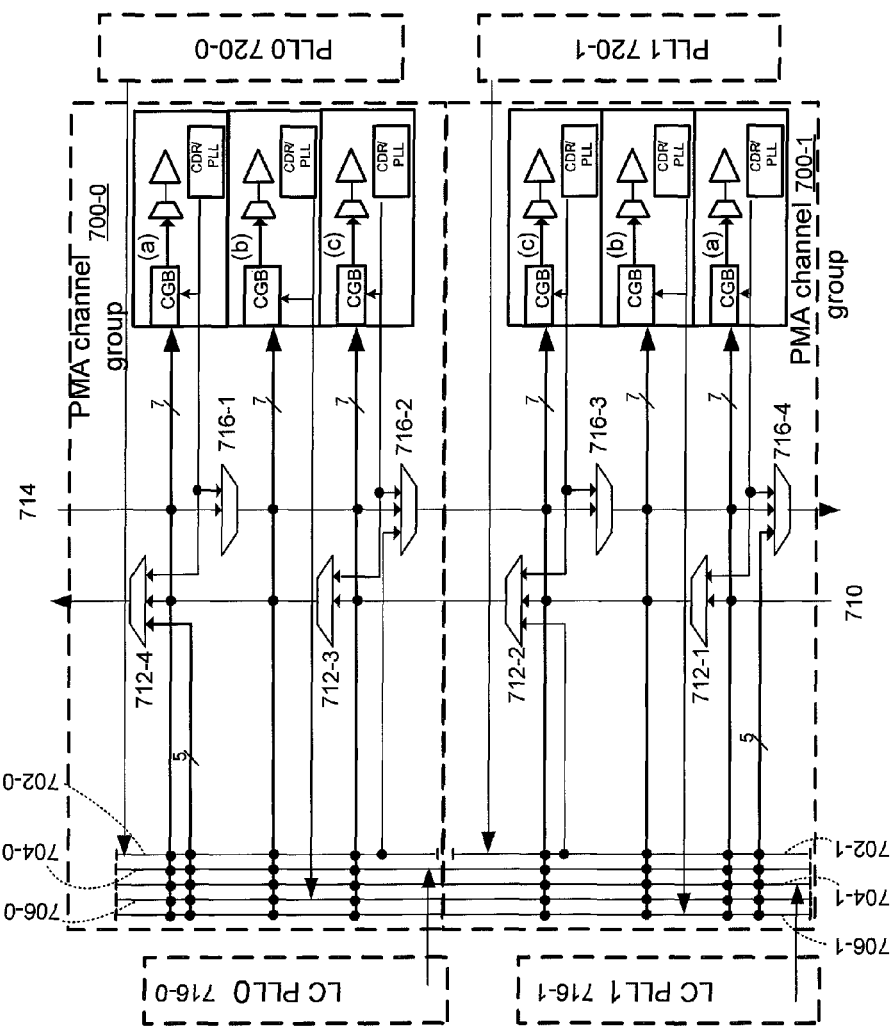
FIG. 7 shows a programmable clock network which interconnects PLLs, PMA channel groups, and LC PLLs in accordance with an embodiment of the invention.

The configuration of FIG. 6 effectively creates two clock network segments. The first segment includes the first through third circuit modules (102-1 through 102-3). The second segment includes the fourth through sixth circuit modules (102-4 through 102-6). FIG. 7 shows a programmable clock network which interconnects PLLs 720, PMA channel groups 700, and LC PLLs 722 in accordance with an embodiment of the invention. The LC PLLs are PLLs which include a low-jitter inductor(L)-capacitor(C)-based voltage-controlled oscillator (LC VCO). The clock network may be programmed using configuration bits to implement various configurations. Advantageously, this clock network is programmable such that each of the PLLs 720 and LC PLLs 722 may be selectively used as a transmission PLL of any channel on an adjacent PMA channel group or on a PMA channel group which is a neighbor to the adjacent PMA channel group.

As shown, each channel (a), (b), and (c) of PMA channel group 700-0 has a clock generation block (CGB). In the implementation shown, each CGB receives seven input signals. Five of the input signals are received from a first group of five lines (702-0, 704-0, 704-1, 706-0 and 706-1). The sixth input signal is received from a first series 710 of multiplexers (712-1, 712-2, 712-3 and 712-4), and the seventh input signal is received from a second series 714 of multiplexers (716-1, 716-2, 716-3 and 716-4). As further shown, in this embodiment, the output signal of each channel (a), (b), and (c) of PMA channel group 700-0 may be programmed to be obtained from a clock data recovery/transmission PLL (CDR/PLL) circuit.

Similarly, each channel (a), (b), and (c) of PMA channel group 700-1 has a CGB which receives seven input signals. Five of the input signals are received from a second group of five lines (702-1, 704-0, 704-1, 706-0 and 706-1). The sixth input signal is received from the first series 710 of multiplexers (712-1, 712-2, 712-3 and 712-4), and the seventh input signal is received from the second series 714 of multiplexers (716-1, 716-2, 716-3 and 716-4). In this embodiment, the output signal of each channel (a), (b), and (c) of PMA channel group 700-1 may be programmed to be obtained from a CDR/PLL circuit.

The first group of five lines for PMA channel group 700-0 and the second group of five lines for PMA channel group 700-1 have four lines in common, namely 704-0, 704-1, 706-0 and 706-1. Lines 704-0 and 704-1 are driven by LC PLL0 722-0 and LC PLL1 722-1, respectively. Lines 706-0 and 706-1 are driven by the output signal (from the CDR/PLL block) of the middle channel (b) of the PMA channel groups 700-0 and 700-1, respectively. The remaining line 702-0 in the first group of lines is driven by PLL0, and the remaining line 702-1 in the second group of lines is driven by PLL1.

The first series 710 of multiplexers includes a first multiplexer (MUX) 712-1, a second MUX 712-2, a third MUX 712-3, and a fourth MUX 712-4. These multiplexers are arranged as follows.

The first MUX 712-1 receives the output signal from an outer channel (a) of the PMA channel group 700-1 and also receives a PLL output signal from a fourth MUX 712-4 in a neighboring PMA channel group 700 which is "below" the PMA channel group 700-1. The first MUX 712-1 configurably selects between these two signals.

The second MUX 712-2 receives the output signal from an inner channel (c) of the PMA channel group 700-1, the output signal from the first MUX 712-1, and a signal from the line 702-1 which driven by fPPL1. The second MUX 712-2 configurably selects between these three signals.

The third MUX 712-3 receives the output signal from an inner channel (c) of the PMA channel group 700-0 and also receives the output signal from the second MUX 712-2. The third MUX 712-3 configurably selects between these two signals.

The fourth MUX 712-4 receives the output signal from an outer channel (a) of the PMA channel group 700-0, the output signal from the third MUX 712-3, a signal from the line 702-0 which driven by fPPL0, a signal from the line 704-0, a signal from line 704-1, a signal from the line 706-0, and a signal from line 706-1. The fourth MUX 712-4 configurably selects between these seven signals. The output signal from the fourth MUX 712-4 is provided to a first MUX 712-1 of a neighboring PMA channel group 700 which is "above" the PMA channel group 700-0 in the strip.

The second series 714 of multiplexers includes a first multiplexer (MUX) 716-1, a second MUX 716-2, a third MUX 716-3, and a fourth MUX 716-4. These multiplexers are arranged as follows.

The first MUX 716-1 receives the output signal from an outer channel (a) of the PMA channel group 700-0 and also receives a PLL output signal from a fourth MUX 716-4 in a neighboring PMA channel group 700 which is "above" the PMA channel group 700-0 in the strip. The first MUX 716-1 configurably selects between these two signals.

The second MUX 716-2 receives the output signal from an inner channel (c) of the PMA channel group 700-0, the output signal from the first MUX 716-1, and a signal from the line 702-0 which driven by fPPL0. The second MUX 716-2 configurably selects between these three signals.

The third MUX 716-3 receives the output signal from an inner channel (c) of the PMA channel group 700-1 and also receives the output signal from the second MUX 716-2. The third MUX 716-3 may be configured to select between these two signals.

The fourth MUX 716-4 receives the output signal from an outer channel (a) of the PMA channel group 700-1, the output signal from the third MUX 716-3, a signal from the line 702-1 which driven by fPPL1, a signal from the line 704-0, a signal from line 704-1, a signal from the line 706-0, and a signal from line 706-1. The fourth MUX 716-4 may be configured to select between these seven signals. The output signal from the fourth MUX 716-4 is provided to a first MUX 716-1 of a neighboring PMA channel group 700 which is "below" the PMA channel group 700-1 in the strip.

The flexibility of the various configurations possible for the networks is an advantageous aspect of the present invention. As one example, the network of FIG. 7 may be configured to provide an output frequency signal from PLL0 to any or all of the channels (a), (b), or (c) of the adjacent PMA channel group 700-0. As another example, the network of FIG. 7 may be configured to provide an output frequency signal from LC PLL0 to any or all of the channels (a), (b), or (c) of the two PMA channel groups 700-0 and 700-1. In addition, the first series of MUXes 710 may be configured to transmit clock signals in the downward direction in the figure, the second series of MUXes 714 may be configured to transmit clock signals in the upward direction in the figure. The first and second series of MUXes (710 and 714) form a bidirectional segmentable clock distribution network which may be configured into segments as described above in relation to FIGS. 1-6. Hence, a multitude of configurations may be implemented by appropriate programming of configuration bits that control the various multiplexers and other circuitry.

Figure 8:
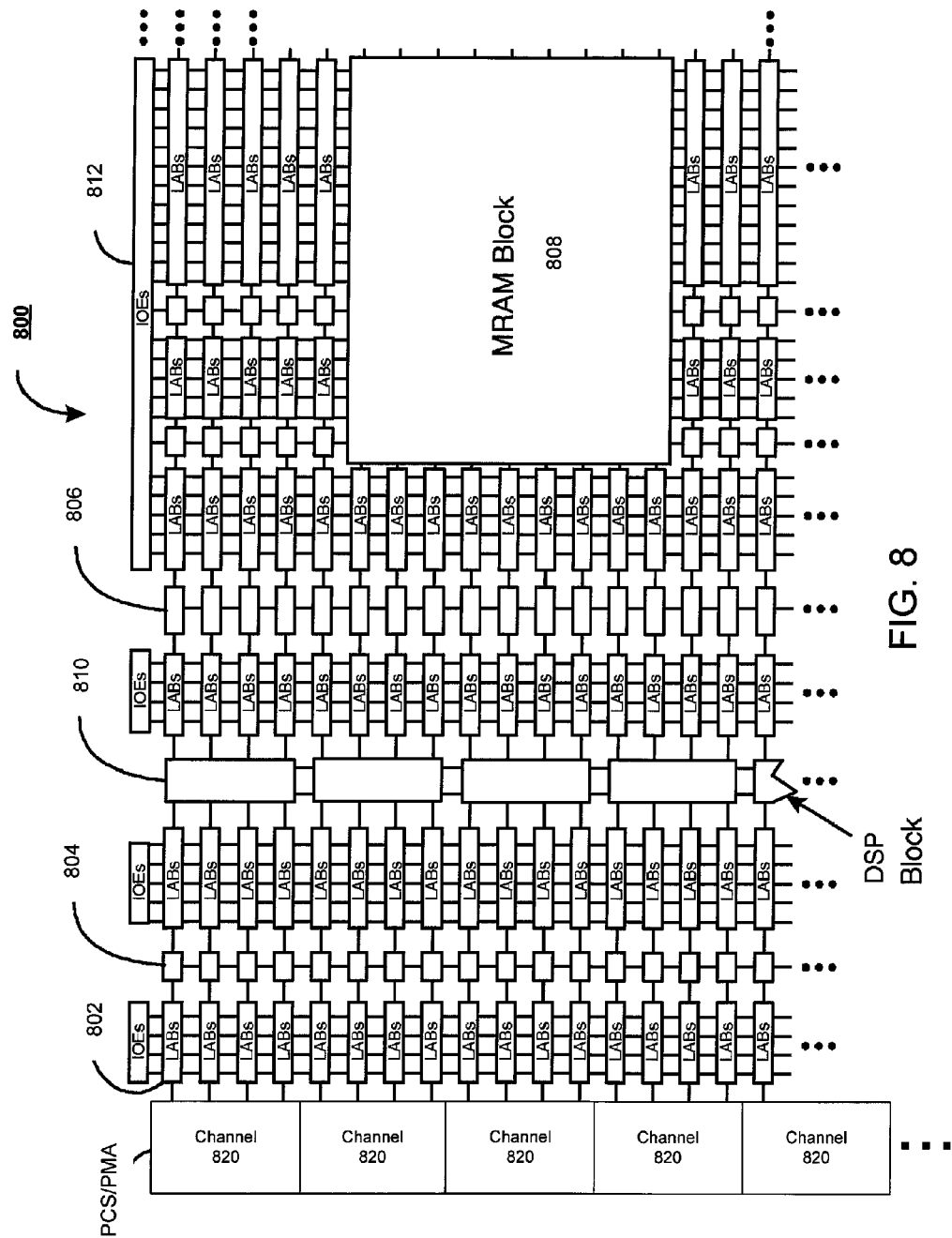
FIG. 8 is a simplified partial block diagram of a field programmable gate array (FPGA) that can include aspects of the present invention.

FIG. 8 is a simplified partial block diagram of a field programmable gate array (FPGA) 800 that can include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 800 includes within its "core" a two-dimensional array of programmable logic array blocks (or LABs) 802 that are interconnected by a network of column and row interconnect conductors of varying length and speed. LABs 802 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including random access memory (RAM) blocks of varying sizes provided throughout the array. The RAM blocks include, for example, blocks 804, blocks 806, and block 808. These memory blocks can also include shift registers and FIFO buffers.

FPGA 800 further includes digital signal processing (DSP) blocks 810 that can implement, for example, multipliers with add or subtract features. Input/output elements (IOEs) 812 located, in this example, around the periphery of the chip support numerous single-ended and differential input/output standards. Each IOE 812 is coupled to an external terminal (i.e., a pin) of FPGA 800. A PCS/PMA (physical coding sublayer/physical media attachment) channel array may be arranged as shown, for example, with each PCS/PMA channel circuit 820 being coupled to several LABs.

The PCS circuitry generally provides digital logic functions which implement data communication protocols, while the PMA circuitry generally provides mixed (analog/digital) signal functionality for the data communications. For example, for certain protocols, the PCS circuitry may be configured to perform, among other functions, 8-bit (octet) to 10-bit encoding for data to be sent to the PMA circuitry and 10-bit to 8-bit decoding for data received from the PMA circuitry. The PCS circuitry may be arranged into channels, where each channel may process data for a stream of data.

The PMA circuitry may be configured to perform, among other functions, serialization of data to be transmitted (conversion from parallel to serial) and de-serialization of received data (conversion from serial to parallel). The PMA circuitry may also be arranged into channels. The PMA circuitry for a channel may include clock data recovery circuitry and transmit phase-locked loop circuitry (CDR/PLL 108). The PMA circuitry for a channel may also include a clock generation buffer (CGB 106).

It is to be understood that FPGA 800 is described herein for illustrative purposes only and that the present invention can be implemented in many different types of PLDs, FPGAs, and ASICs.

Figure 9:
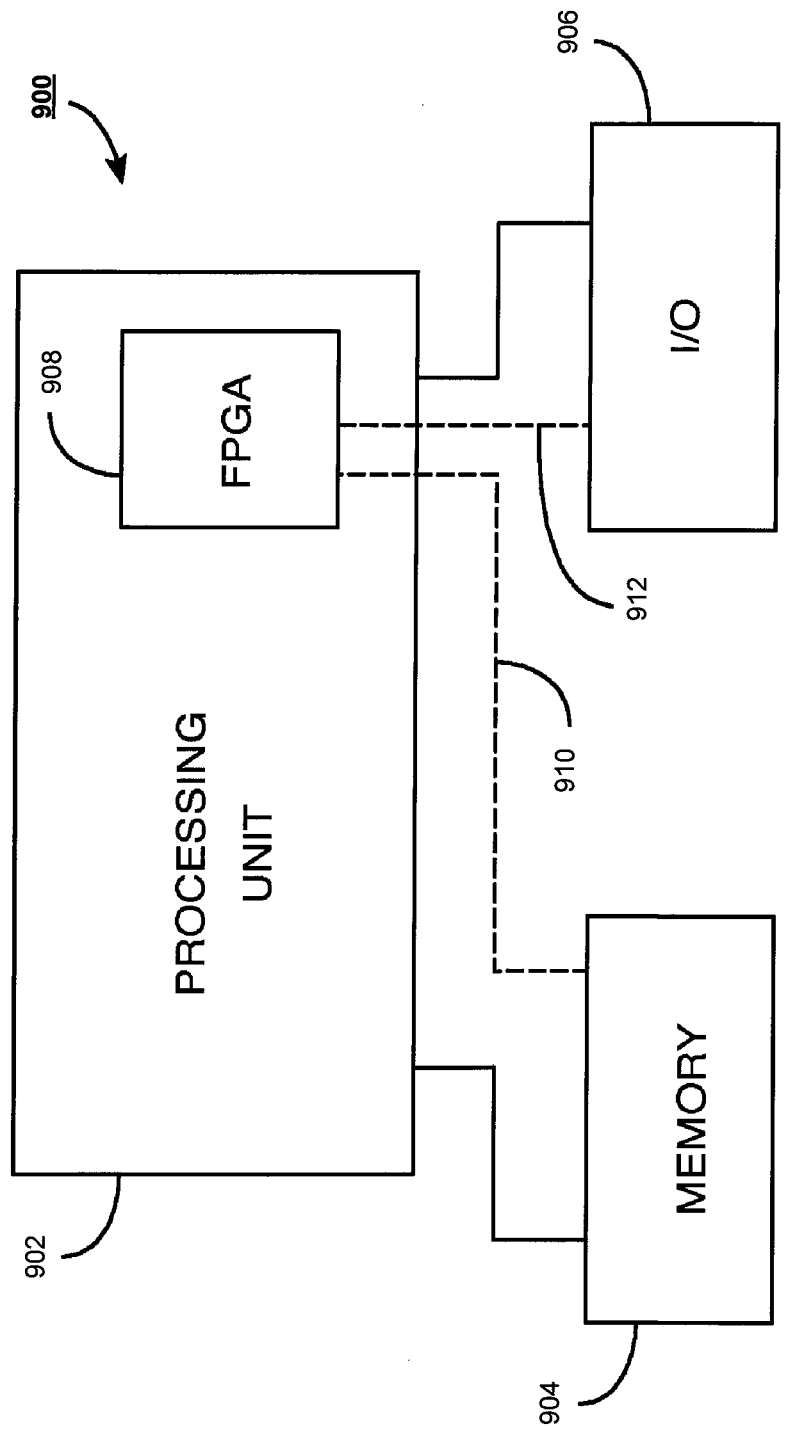
FIG. 9 shows a block diagram of an exemplary digital system that can embody techniques of the present invention.

The present invention can also be implemented in a system that has a FPGA as one of several components. FIG. 9 shows a block diagram of an exemplary digital system 900 that can embody techniques of the present invention. System 900 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 may be provided on a single board, on multiple boards, or within multiple enclosures.

System 900 includes a processing unit 902, a memory unit 904, and an input/output (I/O) unit 906 interconnected together by one or more buses. According to this exemplary embodiment, FPGA 908 is embedded in processing unit 902. FPGA 908 can serve many different purposes within the system in FIG. 6. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 may direct data to an appropriate system component for processing or storage, execute a program stored in memory 904, receive and transmit data via I/O unit 906, or other similar function. Processing unit 902 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 may control the logical operations of the system. As another example, FPGA 908 acts as a reconfigurable processor that may be reprogrammed as needed to handle a particular computing task. Alternately, FPGA 908 may itself include an embedded microprocessor. Memory unit 904 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A clocking network interconnecting an array of transceivers, the clocking network comprising:
   a first series of multiplexers, each multiplexer in the first series being adjacent to a transceiver; and
   a second series of multiplexers, each multiplexer in the second series being adjacent to a transceiver,
   wherein the first series of multiplexers, each multiplexer in the first series selecting one clock signal from multiple clock signals for transmission in a first direction of the array, and
   wherein the second series of multiplexers, each multiplexer in the second series selecting one clock signal from multiple clock signals for transmission in a second direction of the array.

2. The clocking network of claim 1, wherein the second direction is opposite to the first direction.

3. The clocking network of claim 2 further comprising:
   a first multiplexer which is in the first series of multiplexers, the first multiplexer having first and second inputs and an output;
   a second multiplexer which is in the second series of multiplexers, the second multiplexer having first and second inputs and an output;
   a third multiplexer and a fourth multiplexer which are in the first series of multiplexers, wherein the output of the first multiplexer is coupled to an input of the third multiplexer, and the second input of the first multiplexer is coupled to an output of the fourth multiplexer; and
   a fifth multiplexer and a sixth multiplexer which are in the second series of multiplexers, wherein the output of the second multiplexer is coupled to an input of the fifth multiplexer, and the second input of the second multiplexer is coupled to an output of the sixth multiplexer.

4. The clocking network of claim 3, wherein each circuit module comprises:
   a phase-locked loop having an output,
   wherein the output of the phase-locked loop is coupled to the first input of the first multiplexer and the first input of the second multiplexer.

5. The clocking network of claim 4, wherein each circuit module further comprises:
   a clock generation buffer having first and second inputs,
   wherein the first input of the clock generation buffer is coupled to the output of the phase-locked loop, and the second input of the clock generation buffer is coupled to the output of the fifth multiplexer and the output of the fourth multiplexer.

6. The clocking network of claim 5, wherein the first direction comprises an upward direction in the array, the second direction comprises a downward direction in the array, the third and fifth multiplexers are above the circuit module in the array, and the fourth and sixth multiplexers are below the circuit module in the array.

7. An integrated circuit with a programmable data communications interface, the integrated circuit comprising:
- an array of physical media attachment circuits, each physical media attachment circuit including a clock data recovery circuit which is configurable to receive a serial data stream;
- a plurality of phase-locked loop circuits, each phase-locked loop circuit being configured to generate a clock signal; and
- a clock distribution network which is arranged to be programmed into multiple segments, wherein each segment distributes a clock signal to a bounded range of the physical media attachment circuits in the array, wherein the clock distribution network comprises
  - a first plurality of multiplexers in series, each multiplexer of the first plurality of multiplexers being programmable to pass a selected clock signal in a first direction of the clock distribution network, and
  - a second plurality of multiplexers in series, each multiplexer of the second plurality of multiplexers being programmable to pass a selected clock signal in a second direction within the clock distribution network.

8. The integrated circuit of claim 7, wherein the physical media attachment circuits in each bounded range are located adjacent to each other in the array.

9. The integrated circuit of claim 7, wherein the first and second directions are opposite directions within the clock distribution network.

10. The integrated circuit of claim 7, wherein a first multiplexer adjacent to a physical media attachment circuit at a top end of a segment is programmed to not pass the clock signal in the upward direction, and wherein a second multiplexer adjacent to the physical media attachment circuit at a bottom end of a segment is programmed not to pass the clock signal in the downward direction.

11. The integrated circuit of claim 9, wherein the physical media attachment (PMA) circuits are grouped into PMA modules, further comprising:
- a phase-locked loop circuit which outputs a clock signal that is input to a plurality of multiplexers adjacent to the PMA circuits within a PMA module.

12. The integrated circuit of claim 9, further comprising:
- an LC phase-locked loop which outputs a low-jitter clock signal that is input to a plurality of multiplexers adjacent to the PMA circuits within a PMA module.

13. The integrated circuit of claim 7, wherein the clock data recovery circuit is arranged to phase-align a reference clock signal to transitions in the serial data stream so as to recover a data output signal.

14. The integrated circuit of claim 7, wherein the integrated circuit comprises a programmable logic device.

15. A method of distributing clock signals in an integrated circuit with a programmable data communications interface, the method comprising:
- programmably configuring an array of physical media attachment circuits, each physical media attachment circuit including a clock data recovery circuit for receiving a serial data stream;
- programmably configuring a distribution network into a plurality of segments using first and second pluralities of multiplexers, each multiplexer of the first plurality of multiplexers being programmable to pass a selected clock signal in a first direction of the clock distribution network, and each multiplexer of the second plurality of multiplexers being programmable to pass a selected clock signal in a second direction within the clock distribution network;
- generating a plurality of clock signals; and
- distributing the plurality of clock signals to the array of physical media attachment circuits using the plurality of segments.

16. The method of claim 15, wherein each segment distributes a clock signal to a bounded range of the physical media attachment circuits in the array.

17. The method of claim 16, wherein each segment distributes the clock signal in one direction in the array using a series of multiplexers.

18. The method of claim 17, wherein said one direction is upwards in a first set of segments and downwards in a second set of segments.

19. The method of claim 15, wherein the plurality of clock signals include clock signals generated by phase-locked loops within the physical media attachment circuits and clock signals generated by phase-locked loops outside the physical media attachment circuits.

* * * * *